US006731665B2

(12) United States Patent
Trezza

(10) Patent No.: US 6,731,665 B2
(45) Date of Patent: May 4, 2004

(54) LASER ARRAYS FOR HIGH POWER FIBER AMPLIFIER PUMPS

(75) Inventor: John Trezza, Nashua, NH (US)

(73) Assignee: Xanoptix Inc., Merrimack, NH (US)

( * ) Notice: Subject to any disclaimer, the term of this patent is extended or adjusted under 35 U.S.C. 154(b) by 0 days.

(21) Appl. No.: 10/180,367

(22) Filed: Jun. 26, 2002

(65) Prior Publication Data

US 2003/0039281 A1 Feb. 27, 2003

Related U.S. Application Data

(63) Continuation-in-part of application No. 09/896,189, filed on Jun. 29, 2001, and a continuation-in-part of application No. 09/897,160, filed on Jun. 29, 2001, and a continuation-in-part of application No. 09/896,983, filed on Jun. 29, 2001, and a continuation-in-part of application No. 09/897,158, filed on Jun. 29, 2001, and a continuation-in-part of application No. 09/896,797, filed on Jun. 29, 2001.
(60) Provisional application No. 60/302,600, filed on Jun. 29, 2001, provisional application No. 60/365,489, filed on Mar. 18, 2002, and provisional application No. 60/365,996, filed on Mar. 19, 2002.

(51) Int. Cl.[7] .......................... H01S 3/094; H01S 3/091; H01S 3/092; H01S 3/093; H01S 3/00
(52) U.S. Cl. .......................... 372/75; 372/70; 359/341.3
(58) Field of Search .............................. 257/80, 82, 84, 257/81, 88, 90; 438/27, 28; 359/341.1, 341.3, 160, 161; 372/50, 70, 75, 96, 97, 102

(56) References Cited

U.S. PATENT DOCUMENTS

| 4,481,403 A | | 11/1984 | Del Monte |
| 4,533,833 A | | 8/1985 | Copeland et al. |
| 5,100,480 A | | 3/1992 | Hayafuji |
| 5,212,707 A | | 5/1993 | Heidel et al. |
| 5,266,794 A | | 11/1993 | Olbright et al. |
| 5,269,453 A | | 12/1993 | Melton et al. |
| 5,299,222 A | * | 3/1994 | Shannon et al. ............... 372/75 |
| 5,385,632 A | | 1/1995 | Goossen |
| 5,477,933 A | | 12/1995 | Nguyen |
| 5,485,480 A | * | 1/1996 | Kleinerman .................... 372/6 |
| 5,499,313 A | * | 3/1996 | Kleinerman ................. 385/123 |
| 5,511,085 A | * | 4/1996 | Marshall ....................... 372/22 |
| 5,521,734 A | | 5/1996 | Frigo |
| 5,602,863 A | * | 2/1997 | Itagaki ......................... 372/50 |
| 5,637,885 A | * | 6/1997 | Heinemann et al. .......... 257/84 |

(List continued on next page.)

OTHER PUBLICATIONS

Aronson, L.B., "Low–Cost Multimode WDM for Local Area Networks Up to 10 Gb/s", *IEEE Photonics Technology Letters*, vol. 10, No. 10, pp. 1489–1491, Oct. 1998.
Fiore, A. et al., "Postgrowth Tuning of Semiconductor Vertical Cavities for Multiple–Wavelength Laser Arrays", *IEEE Journal of Quantum Electronics*, vol. 35, No. 4, pp. 616–623, Apr. 1999.
MacDougal H. and Dapkus, P. "Wavelength Shift of Selectively Oxidized $Al_xO_y$–AlGaAs–GaAs Distributed Bragg Reflectors", *IEEE* pp. 884–886, 1997.
International Search Report dated Nov. 12, 2002.
International Search Report dated Dec. 17, 2002.

(List continued on next page.)

*Primary Examiner*—Erik J. Kielin
*Assistant Examiner*—William Vesperman
(74) *Attorney, Agent, or Firm*—Morgan & Finnegan, LLP

(57) ABSTRACT

A pump laser capable of delivering at least a specified amount of output power is described. The pump laser has an array of N semiconductor lasers each having a first wavelength and an individual available output power (P) such that the product of N times P is equal to or greater than the specified amount of output power. The pump laser also has a coupler configured to couple light emitted by the individual lasers in the array to an individual optical fiber.

13 Claims, 4 Drawing Sheets

U.S. PATENT DOCUMENTS

| | | | |
|---|---|---|---|
| 5,715,270 A | * 2/1998 | Zediker et al. | ............... 372/75 |
| 5,729,038 A | 3/1998 | Young et al. | |
| 5,793,789 A | 8/1998 | Ben-Michael et al. | |
| 5,814,889 A | 9/1998 | Gaul | |
| 5,861,968 A | 1/1999 | Kerklaan et al. | |
| 5,909,294 A | 6/1999 | Doerr et al. | |
| 5,912,997 A | 6/1999 | Bischel et al. | |
| 5,946,130 A | * 8/1999 | Rice | ........................... 359/349 |
| 5,962,846 A | 10/1999 | Goossen | |
| 5,991,479 A | * 11/1999 | Kleinerman | ................. 385/31 |
| 6,005,262 A | 12/1999 | Cunningham | |
| 6,023,361 A | 2/2000 | Ford et al. | |
| 6,046,659 A | * 4/2000 | Loo et al. | ................... 333/262 |
| 6,048,751 A | 4/2000 | D'Asaro et al. | |
| 6,118,908 A | 9/2000 | Bischel et al. | |
| 6,136,623 A | 10/2000 | Hofstetter et al. | |
| 6,172,417 B1 | 1/2001 | Goossen | |
| 6,184,066 B1 | 2/2001 | Chino et al. | |
| 6,215,114 B1 | 4/2001 | Yagi et al. | |
| 6,253,986 B1 | 7/2001 | Brofman | |
| 6,283,359 B1 | 9/2001 | Brofman | |
| 6,296,779 B1 | * 10/2001 | Clark et al. | ................... 216/66 |
| 6,317,235 B1 | 11/2001 | Hamilton | |
| 6,340,113 B1 | 1/2002 | Avery et al. | |
| 6,343,171 B1 | 1/2002 | Yoshimura et al. | |
| 6,404,542 B1 | 6/2002 | Ziari et al. | |
| 6,438,150 B1 | 8/2002 | Yoo | |
| 6,440,767 B1 | * 8/2002 | Loo et al. | ..................... 438/52 |
| 6,532,101 B2 | 3/2003 | Islam et al. | |
| 6,553,044 B1 | 4/2003 | Eden | |
| 2001/0020739 A1 | 9/2001 | Honda | |
| 2001/0030782 A1 | 10/2001 | Trezza | |
| 2001/0038103 A1 | 11/2001 | Nitta et al. | |
| 2002/0051268 A1 | 5/2002 | Tonehira et al. | |
| 2002/0081773 A1 | 6/2002 | Inoue et al. | |
| 2002/0098613 A1 | * 7/2002 | Loo et al. | ..................... 438/73 |
| 2002/0154355 A1 | * 10/2002 | Payne et al. | ................ 359/124 |
| 2002/0168139 A1 | 11/2002 | Clarkson et al. | |
| 2002/0171518 A1 | * 11/2002 | Hsu et al. | ..................... 335/78 |

OTHER PUBLICATIONS

Ahadian, J.F., et al., "Practical OEIC's Based on the Monolithic Integration of GaAs–InGap LED's with Commercial GaAs VLSI Electronics", IEEE Journal of Quantum Electronics, vol. 34, No. 7, pp. 1117–1123, Jul. 1998.

Alduino, A.C. et al., "Quasi–Planar Monolithic Integration of High–Speed VCSEL and Resonant Enhanced Photodetector Arrays", IEEE Photonics Technology Letters, vol. 11, No. 5, pp. 512–514, May 1999.

Anderson, B., "Rapid Processing And Properties Evaluation Of Flip–Chip Underfills", Dexter Electronic Materials, 9 pages.

Corbett, B. et al., "Resonant Cavity Light Emitting Diode and Detector Using Epitaxial Liftoff", IEEE, vol. 5, No. 9, pp. 1041–1043, Sep. 1993.

Geib, K.M. et al., "Monolithically Integrated VCSELs and Photodetectors for Microsystem Applications", IEEE, pp. 27–28, 1998.

Goodman, J. et al., "Optical Interconnections for VLSI Systems", Proceedings of the IEEE, vol. 72, No. 7, pp. 850–865, Jul. 1984.

Goossen, K. W. et al., "GaAs 850 nm Modulators Solder–Bonded to Silicon", IEEE Photonics Technology Letters, vol. 5, No. 7, Jul. 1993.

Goossen, K.W. et al., "GaAs MQW Modulators Integrated with Silicon CMOS", IEEE Photonics Technology Letters, vol. 7, No. 4, pp. 360–362, Apr. 1995.

Hibbs–Brenner, M.K., et al., "VCSEL/MSM Detector Smart Pixel Arrays", IEEE, pp. 3 and 4, 1998.

Lesser, M.P. et al., "Bump Bonded Back Illuminated CCDs", SPIE, vol. 1656, pp. 508–516, 1992.

McLaren T. et al., "Assembly of VCSEL Based Smart Pixel Arrays", IEEE/LEOS Summer Topical Meeting: Smart Pixels, pp. 49 and 50, Aug. 1996.

Nakahara, T., et al., "Hybrid Integration of Smart Pixels by Using Polyimide Bonding: Demonstration of a GaAs p–i–n Photodiode/CMOS Receiver", IEEE Journal Of Selected Topics In Quantum Electronics, pp. 209–216, 1999.

Ohsaki, T., "Electronic Packaging in the 1990's—A Perspective From Asia", IEEE Transactions On Components, Hybrids, And Manufacturing Technology, vol. 14, No. 2, pp. 254–261, Jun. 1991.

Pommerrenig, D.H. et al., "Hybrid silicon focal plane development: an update", SPIE, vol. 267, pp. 23–30, 1981.

Pu, R. et al., "Comparison of Techniques for Bonding VCSELs Directly to ICs", SPIE vol. 3490, pp. 498–501, Jun. 2005.

Pu, R. et al., "Hybrid Integration of VCSELs to Foundry Fabricated Smart Pixels", IEEE/LEOS Spring Meetings, pp. 25 and 26, 1997.

Sasaki, J. et al., "Self–aligned Assembly Technology for Optical Devices Using AuSn Solder Bumps Flip–Chip Bonding", pp. 260–261.

* cited by examiner

| # Lasers | Coupling efficiency | Output Power | Chip Size |
|---|---|---|---|
| 72 | 70% | 0.504 | |
| 144 | 70% | 1.008 | 1.5mm x 1.5mm |
| 576 | 70% | 4.032 | 3mm x 3mm (1.5mm x 1.5mm) |
| 1024 | 70% | 7.168 | 4mm x 4mm (2mm x 2mm) |

LASER ARRAYS FOR HIGH POWER FIBER AMPLIFIER PUMPS

CROSS REFERENCE TO RELATED APPLICATIONS

This application claims priority under 35 USC 119(e)(1) of U.S. Provisional Patent Application Ser. No. 60/302,600, filed Jun. 29, 2001, U.S. Provisional Patent Application Ser. No. 60/365,996, filed Mar. 19, 2002, and U.S. Provisional Patent Application Ser. No. 60/365,489, filed Mar. 18, 2002.

This application is also a continuation in part of commonly assigned U.S. patent application Ser. No. 09/896,189, U.S. patent application Ser. No. 09/897,160, U.S. patent application Ser. No. 09/896,983, U.S. patent application Ser. No. 09/897,158, and U.S. patent application Ser. No. 09/896,797, all filed Jun. 29, 2001.

FIELD OF THE INVENTION

This invention relates to lasers and, more particularly, to lasers used to amplify optical signals.

BACKGROUND OF THE INVENTION

Optical fiber amplifiers are often used in optical fiber systems to prevent data from being attenuated while traveling through an optical fiber system. Data attenuation between transmitter and receiver is a problem in optical fiber systems. This is because, if the data is attenuated during its travel from the transmission end to the receiving end, when the data arrives at the receiving end the data may not be readable.

To address the above problem, optical fiber systems make use of optical fiber amplifiers that add energy to the signal via a pump laser. However, optical fiber amplifiers require a large input power, in excess of several watts, and must be reliable over a long period of time. As a result, creating a reliable pumping source that also has high power has proven difficult.

The use of multiple pump lasers that have a suitable collective power has also been tried. Although such multiple pump lasers exist, they only use a maximum of four discrete lasers. With a small number of lasers, a failure of one or more lasers substantially affects the output power, thereby reducing reliability. Good pump lasers are also highly temperature sensitive, so there is a high cost associated with maintaining a pump laser within a narrow temperature band. Thus, there is a need for a way to create a cheap reliable pumping laser.

SUMMARY OF THE INVENTION

In accordance with the invention, creation of a pump laser that does not suffer from the problems of the prior art is made possible.

One aspect of the invention involves a pump laser capable of delivering at least a specified amount of output power. The pump laser has an array of N semiconductor lasers, each having a first wavelength and an individual available output power (P). The individual available output power is such that the product of N times P is equal to or greater than the specified amount of output power. The pump laser also has a coupler configured to couple light emitted by the individual lasers in the array to an individual optical fiber.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

U.S. Provisional Patent Application Ser. No. 60/302,600, filed Jun. 29, 2001, U.S. Provisional Patent Application Ser. No. 60/365,996, filed Mar. 19, 2002, and U.S. Provisional Patent Application Ser. No. 60/365,489, filed Mar. 18, 2002, U.S. patent application Ser. No. 09/896,189, filed Jun. 29, 2002, U.S. patent application Ser. No. 09/897,160, filed Jun. 29, 2002, U.S. patent application Ser. No. 09/896,983, filed Jun. 29, 2002, U.S. patent application Ser. No. 09/897,158, filed Jun. 29, 2002, and U.S. patent application Ser. No. 09/896,797, filed Jun. 29, 2002, are all incorporated by reference herein in their entirety.

Figure 1:
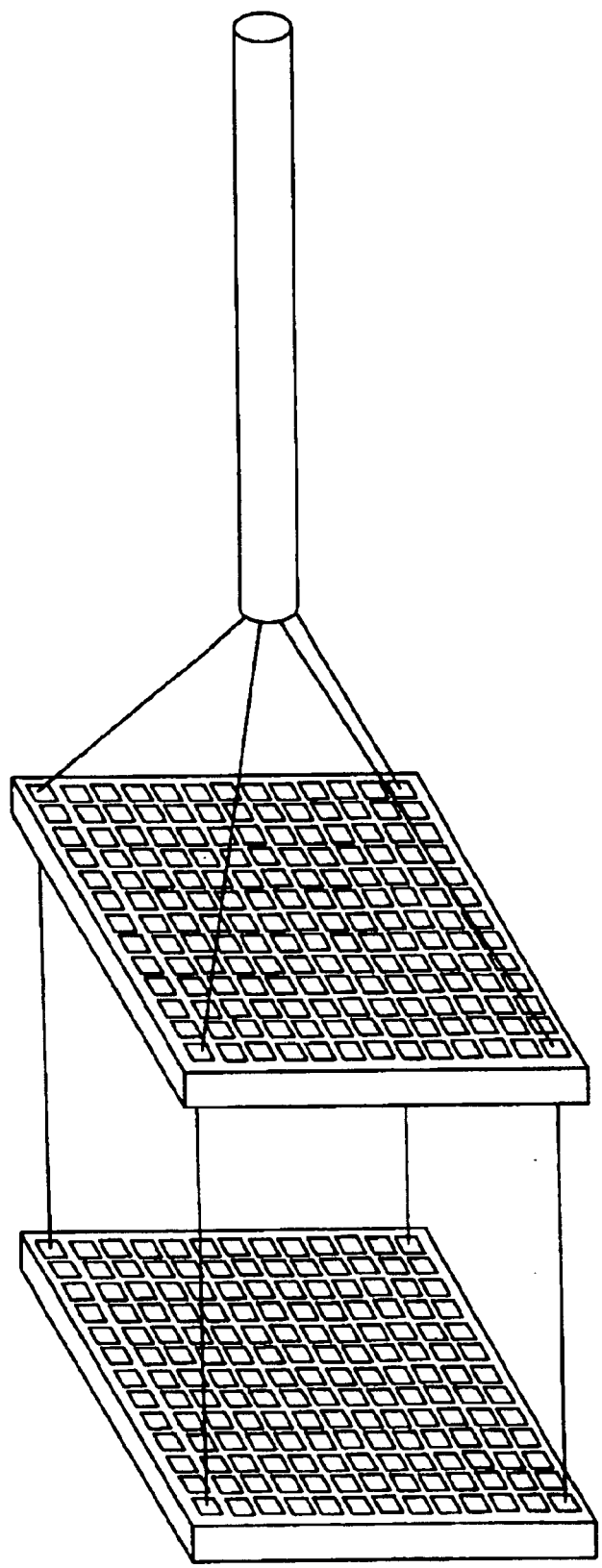
FIG. 1 is a an example of a laser array according to one variant of the invention.

FIG. 1 shows one example of a laser array constructed in accordance with the invention. The laser array is made up of either many discrete lasers, multiple individual lasers each having two or more active regions, or some combination thereof (interchangeably referred to herein as "lasers" or "laser elements"). Depending upon the particular application in which the pump laser is to be used, the lasers will have a wavelength of 968 nm, 980 nm, 14380 nm, "14XX" nm, or some combination thereof.

As shown in FIG. 1, the lasers are coupled to a fiber by a lens array. The lens array is enlarged to illustrate how it couples light from the array's individual laser elements into the optical fiber. As shown in FIG. 1, for purposes of example, the array is a 13×13 array of lasers (i.e. 169 laser elements) with each being capable of outputting at least $1/169^{th}$ of the output required of a pumping laser. Of course, depending upon the particular implementation, the size of the array can be increased or decreased to meet specific requirements of the intended application and the lasers used.

Additionally, for coupling the laser output to the fiber, lens arrays of different sizes or types (including single and compound lens arrays) can be used depending upon the particular application, either alone or in conjunction with other optical elements. For example, if an extremely large laser array is used, for example a 100×100 array, a larger lens array, a combination of lenses and arrays or additional elements such as faceplates, collimators, waveguides, etc. may be needed to properly focus the beam onto the optical fiber.

Figure 2:
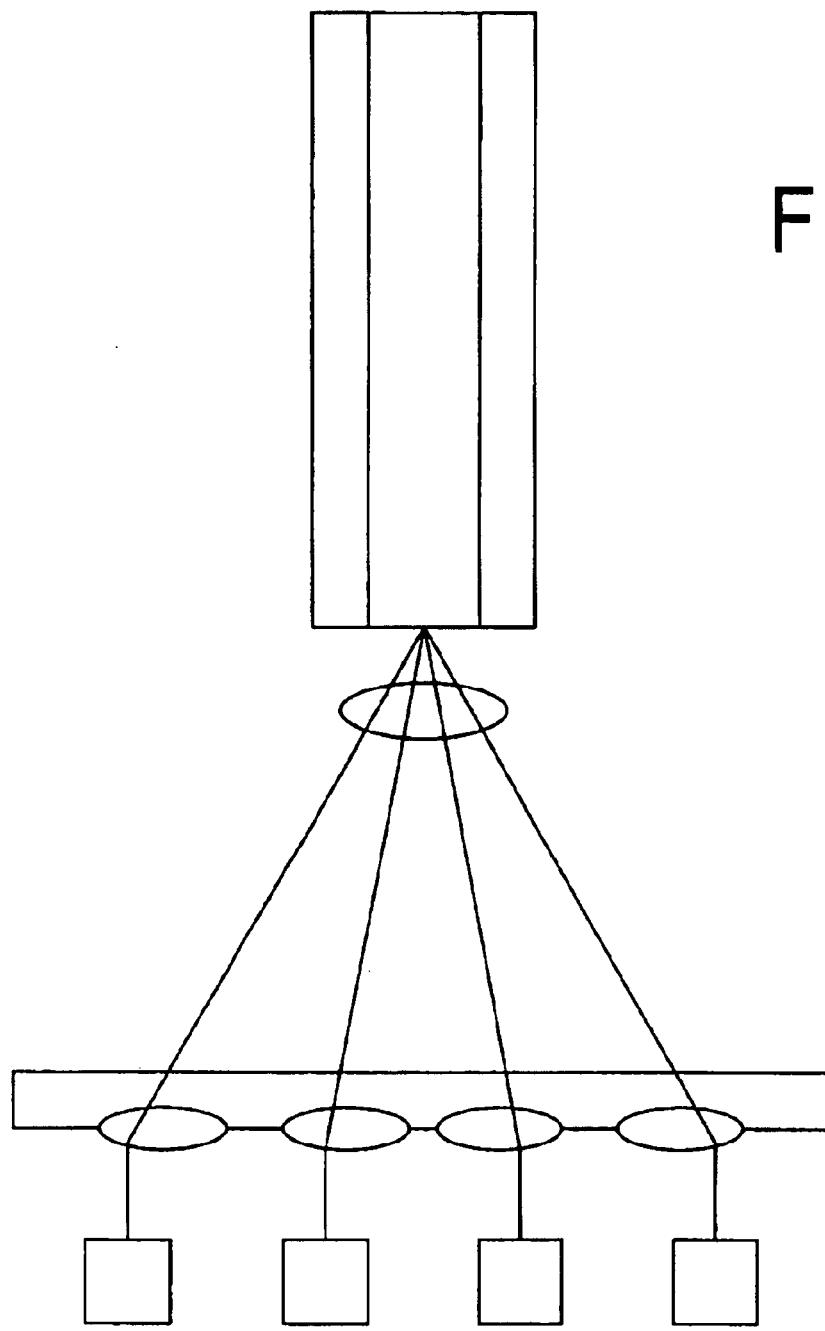
FIG. 2 illustrates a lens array approach to coupling a laser array to a common fiber.

FIG. 2 shows one variant of the invention involving a lens array approach. Each laser element in the array releases a light beam that passes through a corresponding lens element in the lens array. The lens array directs the beams toward the opening of the optical fiber.

Depending upon the lenses and fiber, the light goes directly into the fiber or goes from the lens array through one or more lenses. The lens then focuses the light into a single beam that travels down the optical fiber. Although the FIG. 2 shows only one bi-convex lens to focus the beams from the laser elements into the fiber, multiple lenses can be used for large arrays. Additionally, in some cases the light may need to be focussed more narrowly, for example, if the optical fiber is a single mode fiber (i.e. it is extremely small). In such cases, more lenses or a more complex arrangement of elements can be used.

Figure 3:
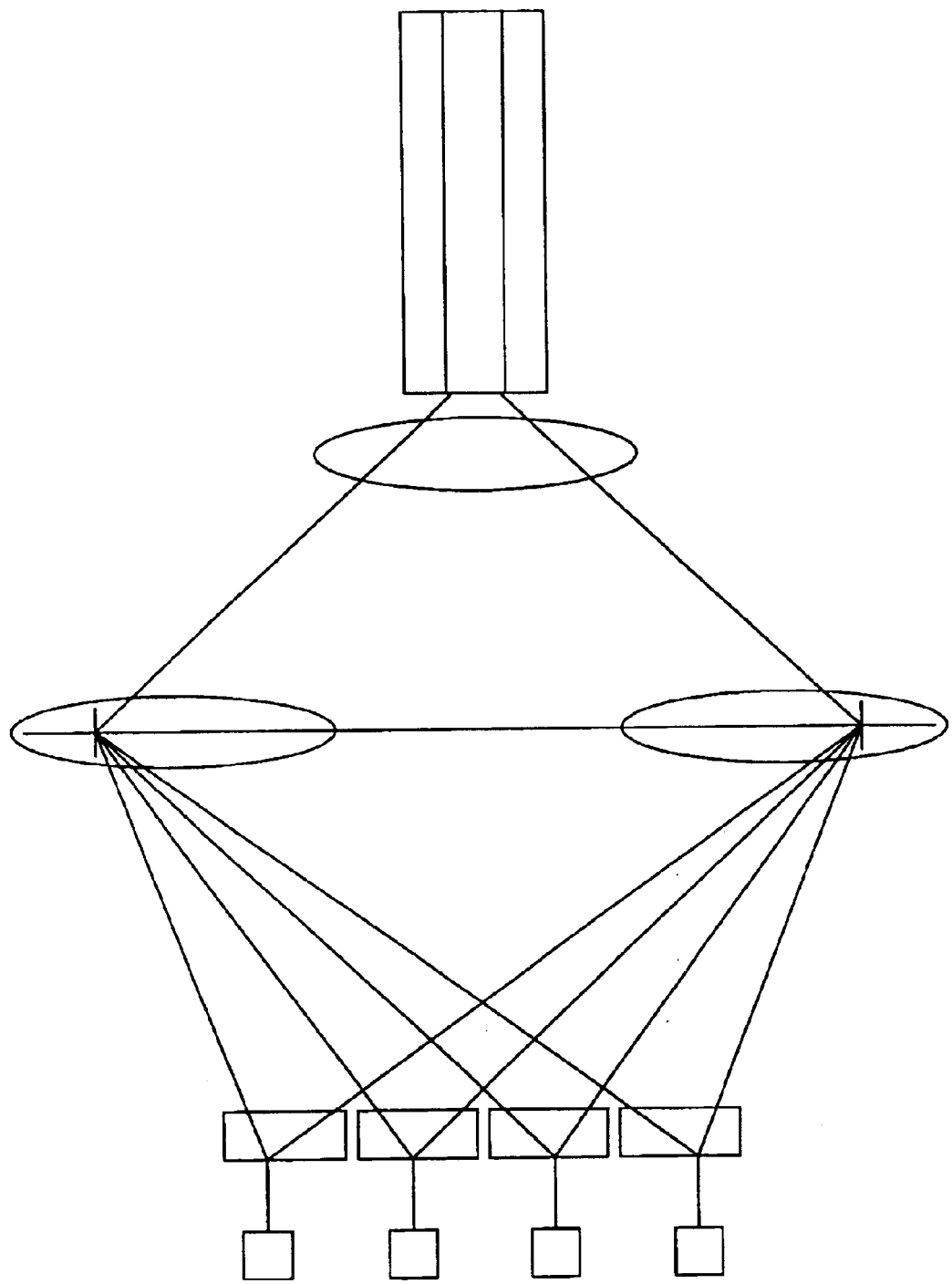
FIG. 3 illustrates an alternate approach to the approach of FIG. 2 using diffractive optical elements.

FIG. 3 shows an alternate variant of the invention. In this variant, each laser element of the laser array emits a light beam into a diffractive optical element (DOE). The DOE defracts the light toward a first tier of bi-convex lenses. The layer of bi-convex lenses collect light from the DOE array and focuses the light toward one or more additional lenses on a tier between the first tier and the optical fiber. A lens, near the fiber, focuses the incidental light from the laser array into the optical fiber.

Although FIG. 3 shows two tiers of lenses, additional tiers can be added (with or without other elements) for different applications. In addition, the diffraction gradient could, in fact, be made up of multiple tiers depending upon, for example, the wavelength of emitted light, the size of the laser array, etc.

Figures 4, 5:
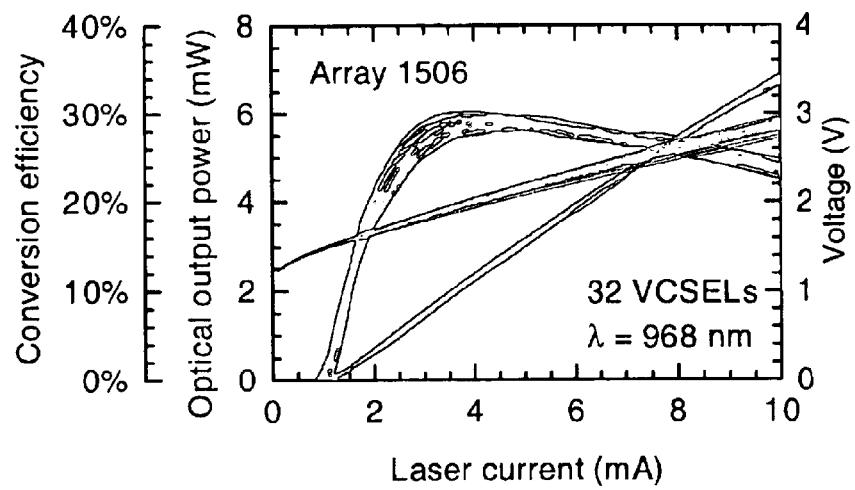
FIG. 4. is a graph showing measurements taken from a 980 nm laser array constructed according to the principles of the invention.
FIG. 5. is a table showing coupling efficiency, output power, and chip size for different sized laser arrays in accordance with the invention.

FIG. 4 shows experimental measurements made by a vertical cavity surface emitting pumping laser, constructed according to the teachings of the invention, with 32 laser elements each having wavelengths of 968 nm. As the current to the lasers increases from 0 to 10 mA the output voltage of the laser increases from 1.25V to nearly 3V. The output power increases from 0 mW to nearly 6.25 mW. The conversion efficiency of the laser array varies from 0% to 30% as the laser current is increased. Maximum efficiency is achieved at approximately 3.5 mA.

FIG. 5 is a pump power analysis table for several different sized arrays according to the teaching of the invention. For each array size, the coupling efficiency was about 70%. As expected, the output power is larger for arrays containing more elements. Specifically, the power increases linearly with respect to the number of laser elements in the array. For example, with 72 lasers the power is 0.504 mW while with 1024 lasers, the power is 7.168 mW.

As shown in FIG. 5, although increasing the number of laser elements means that the size of the optical component chip and/or die must be increased, increasing the size of the array from 144 lasers, which has a size of 1.5 mm×1.5 mm, to 576 lasers (a 4×increase in number of lasers) does not increase the optical component chip size at all and only increases the die size to 3 mm×3 mm (an increase of only 1.5 mm per side). Similarly, an increase to 1024 lasers from 144 lasers adds 880 lasers but increases the optical component chip size by only 0.5 mm per side while increasing the die size by only 2.5 mm per side to accommodate the 880 additional connection points. Thus, an extremely large array can be constructed within a small area.

Although the table only lists four array sizes, it illustrates an advantage achievable at low cost, namely scalability since the number of laser elements can be readily increased to thousands of laser elements.

Another advantage achievable in some implementations is compact size. This is accomplished by integrating the lasers into a custom-made integrated circuit ("IC") using wafer scale technology, for example using a technique described in the incorporated by reference, commonly assigned, U.S. patent applications entitled "Opto-Electronic Device Integration", Ser. Nos. 09/896,189, 09/897,160, 09/896,983, 09/897,158. The IC is scalable and can be built with thousands of array elements for different applications. The cost of mass producing the laser array future modifications and/or variations of the design are low relative to the cost of pumping lasers in the prior art.

Another advantage of this invention is that it can be used for different applications or with different devices. For example, although 980 nm lasers were used for the experimental data of FIG. 4, this invention can be used with lasers of different wavelengths including lasers having the typical 968 nm, 980 nm, 1480 nm, or 14XX nm wavelengths, to identify a few.

Moreover, the ability to change the output power of the entire array by adjusting the power level of the individual laser elements by small incremental amounts means that the array can readily be used in systems that require different amounts of signal boast.

Another advantage achievable by applying the teachings of the invention is longer device life. There are at least three different mechanisms for ensuring a long lifetime for the pumping lasers. The first mechanism is passive in that, with laser arrays according to the invention, if a single laser or, in the case of a very large array even a significant number of lasers, fails to operate properly, the overall power of the array will not be significantly affected. For example, if one laser element in an array of 1024 fails, the total output power decreases by only 0.098%. For many applications the reduction in power is too small to adversely affect performance. Moreover, since increasing the size of the array corresponds to a decrease in individual power to each laser element, the affect of an element failing decreases for larger arrays. Therefore, the efficiency of the passive mechanism increases as larger arrays are used.

The second mechanism used by this invention to achieve a long lifetime is redundancy. Redundancy is achieved by providing each laser with at least one backup such as shown in the commonly assigned U.S. patent application Ser. No. 09/896,797 entitled "Redundant Optical Device Array" the entire disclosure of which is incorporated herein by reference. The lasers are integrated onto an integrated circuit (IC) with the ability to automatically switch to backup devices if necessary. If a laser fails, the backup can be manually or automatically turned on to take the place of the original. This prevents the total output power of the laser array from decreasing as the device progresses through its life cycle. For example, a 144-element laser array could be configured to have 72 operating elements and 72 backups. If a laser element ceases to function, its backup element can be used in its place and adds to the power of the remaining lasers to achieve the same total output power as the original 72 lasers. The same array could also be configured to have 136 operating elements and only 12 backups for applications where the life cycle is expected to be significantly shorter than the mean time between failures ("MTBF") associated with 12 lasers failing.

The third mechanism used to ensure a long lifetime is achieved by altering the output power of the laser elements.

For this mechanism, the array is configured so that if a laser element fails, the power to the remaining laser elements will be increased to make up the difference. By using a large array, if an element fails, the fractional increase in power to the remaining functioning elements is small and does not put a strain on the remaining laser elements. For example, if one laser fails in an array of 72, the power to the remaining 71 lasers need only be increased by $1/72$ of the total power before the failure.

Another advantageous aspect is manufacturing yield. In accordance with the present invention, because most variants will have identical lasers, the incremental cost of manufacturing a laser array having 1000 lasers instead of 100 (10× as many) is minimal. As a result, one can readily manufacture an array that is large enough so that the presence of any laser that is defective, does not work or operates in an anomalous or detrimental fashion will have little to no effect on yield.

Building upon the above, it should be appreciated that, by adding a few additional elements in a straightforward manner, the array can be made to function in an intelligent manner. For example, in some implementations the array is constructed to also include one or more photodetectors that are used for feedback purposes.

Depending upon the particular implementation, the photodetectors are used to measure or sample the overall output power of the pump laser. In this manner, if the output power deviates from the desired level by more than a specified amount, the laser drive circuitry can be signaled to cause a change in the output of the individual lasers to compensate for the fluctuation.

Similarly, in some implementations, one or more temperature sensors can be incorporated into the array to allow for laser output fluctuations or drift caused by temperature changes. In those implementations, as temperature changes affect pump laser output power, adjusting the individual lasers as described above makes it possible to compensate.

It is expected that, for some implementations, control and compensation will occur using some form of programmed control. For example, in the simplest cases, a state machine can be used. In other more complex cases, programmed intelligence in the form of a computer, microprocessor, etc. (all hereafter interchangeably referred to as a "processor") will be used.

In the case of a processor, a program is used to process whatever feedback is available, for example, feedback from one or more photodetectors, temperature sensors, etc. and determine what changes, if any, need to be made. Depending upon the particular implementation, this may involve conversion formulas, the use of look up tables or both. If a change needs to be made, the processor, operating under program control will send the appropriate signals to the drive circuitry for the lasers to bring about the desired change.

In more sophisticated implementations, the processor may also be configured to control individual lasers. In this manner, compensation can be controlled on a more granular scale. In addition, this type of arrangement also allows for compensation through bringing individual lasers on and off line, either alone or in conjunction with the controlling of individual laser output as described herein.

It should therefore be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A pump laser capable of delivering at least a specified amount of output power necessary to pump an individual optical fiber, the pump laser comprising:

an array of N semiconductor vertical cavity surface emitting lasers on a common die, each having a first wavelength and an individual output power (P), in normal use, such that the product of N times P is equal to or greater than the specified amount of output power the individual output power P of each of the N lasers also being adjustable such that, if one of the N lasers fails, each individual output of the remaining lasers will be adjusted to a post-failure output power of P+(P/(N−1)) such that, post-failure, the product of N times (P+(P/N−1)) is equal to or greater than the specified amount of output power; and a lens array coupler configured to couple light emitted by all of the individual lasers in the array to the individual optical fiber at the first wavelength.

2. A pump laser capable of delivering at least a specified amount of output power necessary to pump an individual optical fiber, the pump laser comprising:

an array of N semiconductor lasers, wherein N is at least 100, each having a first wavelength and an individual available output power (P) such that the product of N times P is equal to or greater than the specified amount of output power; and a coupler configured to couple light emitted by the individual lasers in the array to the individual optical fiber at the first wavelength.

3. A pump laser capable of delivering at least a specified amount of output power necessary to pump an individual optical fiber, the pump laser comprising:

an array of N semiconductor lasers, wherein N is at least 1000, each having a first wavelength and an individual available output power (P) such that the product of N times P is equal to or greater than the specified amount of output power; and a coupler configured to couple light emitted by the individual lasers in the array to the individual optical fiber at the current wavelength.

4. A pump laser capable of delivering at least a specified amount of output power necessary to pump an individual optical fiber, the pump laser comprising:

an array of N semiconductor vertical cavity surface emitting lasers on a common die, wherein N is a multiple of 2m where m is at least 4, each having a first wavelength and an individual available output power (P) such that, under normal operation, the product of N times P is equal to or greater than the specified amount of output power and, under degraded operation where X number of the lasers has failed, a remaining group of the lasers will operate at a post-failure output of (P+P/(N−X)) so that an aggregate post-failure output power of the N−X lasers is at least equal to the specified amount of output power; and a lens array coupler configured to couple light emitted by the individual lasers in the array to individual optical fiber at the current wavelength.

5. A laser array comprising:

multiple individual lasers of a specified wavelength, each arranged relative to the others for emission into a single fiber, and having an individual output power of at least a fraction of a desired aggregate output for the array, the desired aggregate output being usable to pump the single fiber;

at least one feedback photodetector configured to, when N of the individual lasers of the laser array are operating to pump the single fiber at the specified wavelength, sample an aggregate output of the operating lasers so that, when the aggregate output of the operating lasers into the fiber differs from the desired aggregate output for the array, an output power adjustment can be made to the operating lasers by adjusting each of the operating laser's output power by 1/Nth of the difference between the aggregate output and the desired aggregate output.

6. A pump laser capable of delivering at least a specified amount of output power necessary to pump an individual optical fiber, the pump laser comprising:

an at least 12 by 12 array of N semiconductor lasers each having a first wavelength and an individual available output power (P) such that the product of N times P is equal to or greater than the specified amount of output power to be used to pump the individual optical fiber; and a coupler configured to couple light emitted by the individual lasers in the array to pump the individual optical fiber.

7. The pump laser of one of claims 1,2,3,4 or 6, wherein the first wavelength is 968 nm.

8. The pump laser of one of claims 1,2,3,4 or 6, wherein the first wavelength is 980 nm.

9. The pump laser of one of claims 1,2,3,4 or 6, wherein the first wavelength is 1480 nm.

10. The pump laser of one of claims 1,2,3,4 or 6, wherein the first wavelength is 14XX nm.

11. The laser array of claim 5 further comprising a temperature sensor.

12. The laser array of claim 11 further comprising a processor programmmed to control laser drive circuitry based upon feedback provided by at least one of the photodetector or the temperature sensor.

13. The laser array of claim 5 further comprising a processor programmmed to control laser drive circuitry based upon feedback provided by the photodetector.

* * * * *